US009818777B2

(12) United States Patent
Raynor

(10) Patent No.: US 9,818,777 B2
(45) Date of Patent: Nov. 14, 2017

(54) HYBRID ANALOG-DIGITAL PIXEL IMPLEMENTED IN A STACKED CONFIGURATION

(71) Applicant: STMicroelectronics (Research & Development) Ltd., Marlow, Buckinghamshire (GB)

(72) Inventor: Jeffrey M. Raynor, Edinburgh (GB)

(73) Assignee: STMicroelectronics (Research & Development) Limited, Marlow, Buckinghamshire (GB)

( * ) Notice: Subject to any disclaimer, the term of this patent is extended or adjusted under 35 U.S.C. 154(b) by 195 days.

(21) Appl. No.: 14/939,161

(22) Filed: Nov. 12, 2015

(65) Prior Publication Data

US 2017/0141147 A1    May 18, 2017

(51) Int. Cl.
*H01L 27/14* (2006.01)
*H01L 27/146* (2006.01)

(52) U.S. Cl.
CPC .. *H01L 27/14609* (2013.01); *H01L 27/14643* (2013.01)

(58) Field of Classification Search
CPC .............. H01L 27/14609; H01L 27/14643
See application file for complete search history.

(56) References Cited

U.S. PATENT DOCUMENTS

| 5,233,180 | A | 8/1993 | Tsuruta et al. | |
|---|---|---|---|---|
| 6,998,659 | B2 | 2/2006 | Raynor | |
| 7,541,176 | B2 | 6/2009 | Raynor | |
| 2010/0157035 | A1 | 6/2010 | Purcell et al. | |
| 2016/0343763 | A1* | 11/2016 | Kagawa | ............ H01L 21/76807 |
| 2017/0201701 | A1* | 7/2017 | Suzuki | ................... H04N 5/363 |

OTHER PUBLICATIONS

Raynor: "A single-exposure linear HDR 17-bit hybrid 50um analogue-digital pixel in 90 nm BSI," Jul. 2015 (4 pages).
Aoki: "A rolling-shutter distortion-free 3D stacked image sensor with—160dB parasitic light sensitivity in-pixel storage node," Int. Solid State Circuits Conf., 2013, pp. 482-484.
Suntharalingam, et al: "Megapixel CMOS Image Sensor Fabricated in Three-Dimensional Integrated Circuit Technology," MIT Lincoln Lab., ISSCC 2005, Feb. 2005 (35 pages).

* cited by examiner

*Primary Examiner* — Tony Ko
(74) *Attorney, Agent, or Firm* — Gardere Wynne Sewell LLP

(57) ABSTRACT

A hybrid analog-digital pixel circuit is fabricated on two wafers. A first wafer includes the analog pixel circuitry and a second wafer includes the digital control and processing circuitry. Externally accessible contact structures for electrically interconnecting the two wafers are arranged in groups. Each group includes externally accessible contact structures for carrying signals associated solely with operation of a corresponding pixel.

24 Claims, 6 Drawing Sheets

HYBRID ANALOG-DIGITAL PIXEL IMPLEMENTED IN A STACKED CONFIGURATION

TECHNICAL FIELD

This application is directed to image pixels and, in particular, to an analog-digital pixel.

BACKGROUND

FIG. 1 shows a circuit diagram of an analog-digital pixel as taught in U.S. patent application Ser. No. 14/674,728, filed Mar. 31, 2015 (incorporated herein by reference). See, also, Raynor "A single-exposure linear HDR 17-bit hybrid 50 µm analogue-digital pixel in 90 nm BSI", International Image Sensor Workshop, 2015 (also incorporated by reference).

The analog-digital pixel includes a photodiode coupled to a charge injector whose operation is controlled by a clock signal (FineConv Clk) and a control signal (End Frame). A charge integrator circuit is formed by an operational transconductance amplifier having a first input (VINN) and a second input (VRT) and an output (VOUT). A feedback capacitor (Cfb) is coupled between VOUT and VINN. VINN is further coupled to the photodiode to receive an input signal comprising the sum of a photodiode current (Ipd) and a feedback current (Ifb). The second input VRT receives a reset voltage. The output VOUT from the amplifier is coupled to an inverting input of a comparator. The non-inverting input of the comparator receives a reference voltage (VREF). An output of the comparator generates a digital signal (Count) for application to a clock input of a first counter (MS Counter). The digital signal output from the comparator is also referenced as the digital signal Comp that is provided to an input of an oscillator circuit (OSC). A switch is further coupled in parallel with the feedback capacitor. This switch is actuated by a first output of the oscillator circuit. A second input of the oscillator circuit receives a Start Frame control signal which is also applied to the clear (CLR) input of the first counter. A third input of the oscillator circuit receives an End Frame control signal that is also applied to an enable input of the charge injector. An output enable input (OE) of the first counter receives a control signal (Pixel Read). A second counter (LS Counter) has a clock input that receives the clock signal (FineConv Clk) and a clear input (CLR) that receives the logical inversion of the End Frame control signal. A count enable input (Count_EN) of the second counter receives the logical inversion of the Comp signal. An output enable input (Output_EN) receives the Pixel Read signal. The first counter is a ten-bit counter whose output bits form the most-significant Q[4:13] bits of a fourteen bit data bus. The second counter is a four-bit counter whose output bits form the least-significant Q[0:3] bits of the fourteen bit data bus. The digital signal on the data bus presents a digital value of the light sensed by the photodiode.

The analog-digital pixel of FIG. 1 operates in three phases. In a first phase, referred to as a sensor exposure phase, the Start Frame signal is asserted by an external control circuit and applied to the oscillator circuit and the first counter (causing a reset). The oscillator circuit responds to the Start Frame control signal by pulse actuating the switch to cause the feedback capacitor to be discharged, and the voltage at VOUT is set equal to the reset voltage at VRT. This operation is referred to as a resetting the charge integrator circuit. The photodiode responds to illumination by generating the current Ipd. This current is integrated by the charge integrator and the voltage at VOUT ramps. When the ramping VOUT voltage reaches the reference voltage VREF, the comparator changes state at its output (digital signal Count). The first counter responds to change in state of the Count signal by incrementing its counter value. The change in state of the corresponding Comp signal further causes the oscillator circuit to pulse actuate the switch and reset the charge integrator circuit. The foregoing process is then repeated, and each change in state at the output of the comparator causes the first counter to increment its count value. It will be noted that a slope of the ramping voltage at VOUT is correlated to the intensity of the light received by the photodiode. Thus, over a given time period for exposure of the photodiode, the number of times there is a change in state at the output of the comparator (with a corresponding increment of the count value) is proportional to the received light intensity.

At some later point in time the exposure phase ends (for example, in response to shutter closure or disconnection of the photodiode from the integrator). A fine count conversion phase is then commenced. In this regard, ending of the exposure phase may occur at a point in time where the VOUT voltage of charge integrator is somewhere between VRT and VREF. This is referred to in the art as a partial threshold state. The fine count conversion is performed to measure that voltage. During this phase, the first counter is disabled from responding to the Count signal.

The start of the fine conversion phase is indicated by the assertion of the End Frame signal by the external control circuit. The assertion of the End Frame signal produces three results: inhibiting the oscillator circuit from further resetting of the charge integrator, resetting the second counter and enabling the charge injector. The fine conversion clock (FineConv Clk) is applied to both the second counter and the charge injector. The charge injector responds to each pulse in the clock by injecting a small amount of charge into the VINN input of the charge integrator. Each injection of charge is accompanied by a corresponding incrementing of the count value in the second counter. The charge integrator integrates the injected charge and the output voltage VOUT continues to ramp. When the ramping VOUT voltage reaches the reference voltage VREF, the comparator changes state at its output (digital signal Count/Comp). The second counter responds to the change in state of the signal Comp by disabling further incrementing.

At this point, the readout phase is commenced. The output enable signal (Output_EN) is then asserted by the control circuit and the first and second counters output their respective count values. The combination of the output counter values from the first and second counters forms the fourteen-bit digital output signal indicative of the sensed illumination.

Reference is now made to FIG. 2 showing a block diagram for a stacked sensor configuration. A first wafer or die 10 includes a pixel array 12 with a row select circuit 14 and an array of comparators 16 associated with the columns. The outputs of the column comparators 16 are coupled to corresponding externally accessible contact structures (for example, vias or interconnections) 18 of the first die 10. A second wafer or die 20 includes an array of memory cells (SRAM) 22 coupled to corresponding externally accessible contact structures (for example, vias or interconnections) 24 of the second die 20. The externally accessible contact structures 18 and 24 are aligned so that when the first die 10 is stacked on the second die 20, an electrical connection can be made (for example, through a solder bump). A column select circuit 26 is coupled to the memory cells 22. Analogto digital converter (ADC) data is output to a digital processing circuit 28 that functions to control the operation on die 20 through signal bus 30 and generate the data out.

Although FIG. 2 shows that the connection between die 10 and die 20 is made with one electrical connection per column, it will be understood that this is by example only. A one connection per row configuration is also possible.

The stacked configuration of FIG. 2 is advantageous in that analog circuitry is fabricated on the first die 10 and digital circuitry is fabricated on the second die 20.

SUMMARY

In an embodiment, an image sensing system comprises: a sensing wafer including a first semiconductor substrate having a front side and a back side, the front side including a plurality of photosensitive regions sensitive to light received through the back side, each photosensitive region associated with a pixel, the sensing wafer including a plurality of said pixels arranged in an array; the sensing wafer further including a plurality of first metallization layers on the front side of the first semiconductor substrate, said plurality of first metallization layers including a top metallization layer including a plurality of first externally accessible contact structures, said first externally accessible contact structures arranged in a plurality of first groups, the first groups corresponding to the plurality of pixels, the first externally accessible contact structures in each first group carrying signals relating to operation of only the pixel corresponding to that first group; a digital wafer including a second semiconductor substrate having a front side and a back side, the front side including a plurality of integrated circuit regions for implementing digital circuitry, and the digital wafer further including a plurality of second metallization layers on the front side of the second semiconductor substrate, said plurality of second metallization layers including a top metallization layer including a plurality of second externally accessible contact structures, said second externally accessible contact structures arranged in a plurality of second groups, the second groups corresponding to the plurality of pixels, the second externally accessible contact structures in each first group carrying the signals relating to operation of only the corresponding pixel; wherein the first and second externally accessible contact structures in the first and second groups, respectively, are aligned and electrically connected when the sensing wafer and digital wafer are stacked.

In an embodiment, an image sensing system comprises: a first semiconductor substrate having a front side and a back side and a pixel comprising a photosensitive region formed on the front side and sensitive to light received through the back side; a plurality of first metallization layers on the front side of the first semiconductor substrate, said plurality of first metallization layers including a top metallization layer including a group of first externally accessible contact structures arranged in an array of rows and columns, said group of first externally accessible contact structures corresponding to said pixel, the first externally accessible contact structures carrying control signals for controlling operation of only that pixel; a second semiconductor substrate having a front side and a back side, the front side including a plurality of integrated circuit regions for implementing digital circuitry for generating the control signals for controlling operation of that pixel, and a plurality of second metallization layers on the front side of the second semiconductor substrate, said plurality of second metallization layers including a top metallization layer including a group of second externally accessible contact structures arranged in an array of rows and columns, said group of second externally accessible contact structures corresponding to that pixel, the second externally accessible contact structures carrying control signals for controlling operation of only that pixel; wherein the first and second externally accessible contact structures face each other and are aligned and electrically connected.

In an embodiment, an image sensing system comprising: a first semiconductor substrate having a front side and a back side and a pixel comprising a photosensitive region formed on the front side and sensitive to light received through the back side and supporting a charge integrator coupled to photosensitive region and a comparator coupled to the charge integrator; a plurality of first metallization layers on the front side of the first semiconductor substrate, said plurality of first metallization layers including a top metallization layer including a first externally accessible contact structure and a second externally accessible contact structure, said first externally accessible contact structure carrying a comparator output signal and said second externally accessible contact structure carrying a charge integrator reset signal; a second semiconductor substrate having a front side and a back side, the front side including a plurality of integrated circuit regions for implementing digital circuitry for processing the comparator output signal and generating the charge integrator reset signal, and a plurality of second metallization layers on the front side of the second semiconductor substrate, said plurality of second metallization layers including a top metallization layer including a third externally accessible contact structure carrying the comparator output signal and a fourth externally accessible contact structure carrying the charge integrator reset signal; wherein the first and third externally accessible contact structures face each other and are aligned and electrically connected; and wherein the second and fourth externally accessible contact structures face each other and are aligned and electrically connected.

BRIEF DESCRIPTION OF THE DRAWINGS

Reference is now made by way of example only to the accompanying drawings in which.

DETAILED DESCRIPTION OF THE DRAWINGS

Figure 1:
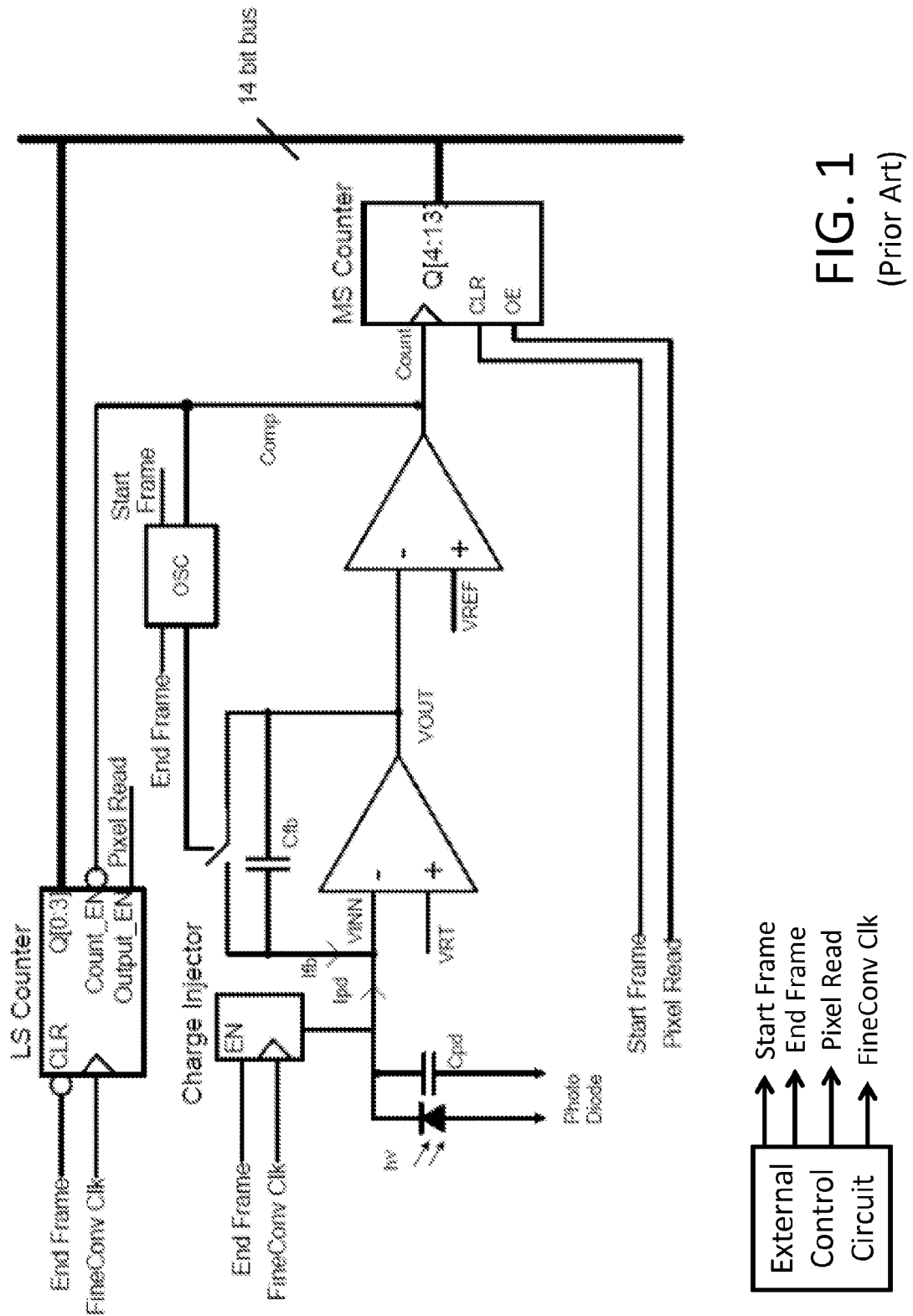
FIG. 1 is a circuit diagram of an analog-digital pixel.
Figure 2:
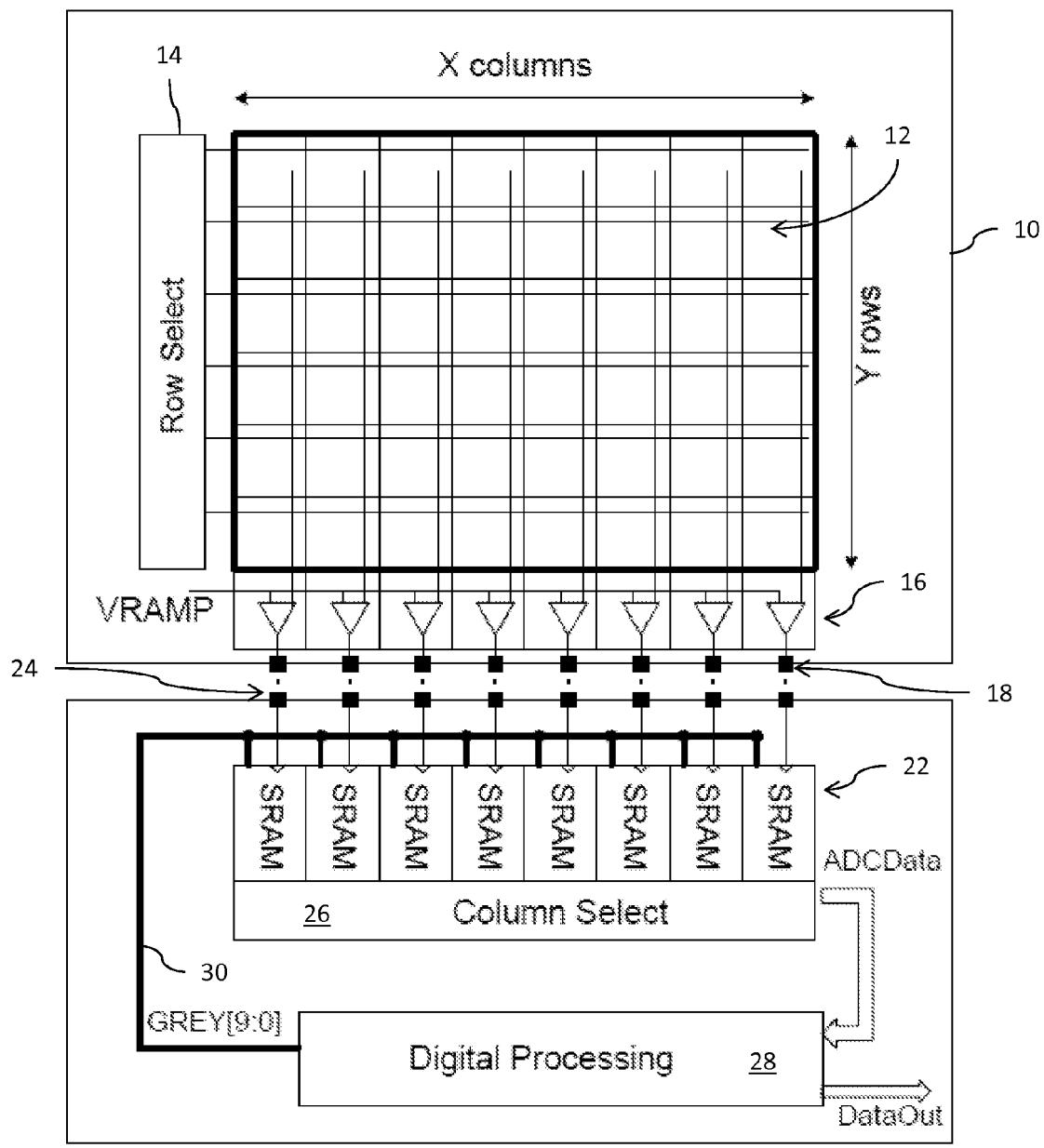
FIG. 2 is a block diagram for a stacked sensor configuration.
Figure 3:
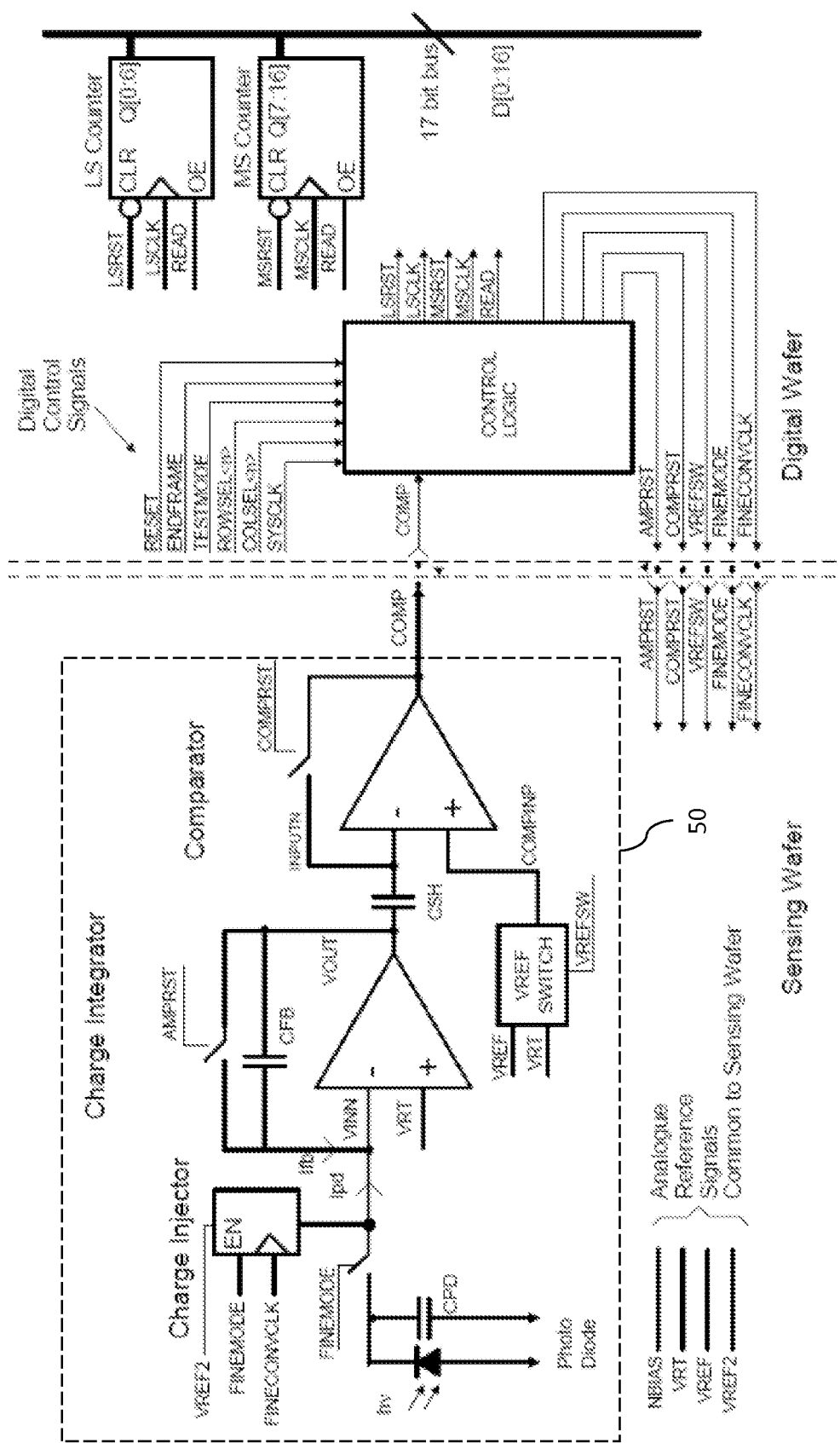
FIG. 3 is a circuit diagram of an analog-digital pixel.

FIG. 3 shows a circuit diagram of an analog-digital pixel. The analog-digital pixel is implemented in a stacked-die configuration. A first die, referred to as the sensing wafer, is stacked on a second die, referred to as the digital wafer.

The first die includes a photodiode coupled to a charge injector whose operation is controlled by a clock signal (FINECONVCLK) and a control signal (FINEMODE). A charge integrator circuit is formed by an operational transconductance amplifier having a first input (VINN) and a second input (VRT) and an output (VOUT). A feedback capacitor (Cfb) is coupled between VOUT and VINN to supply a feedback current (Ifb). VINN is further coupled to the photodiode to receive a photodiode current (Ipd) through a switch that is selectively actuated by the FINEMODE control signal. The second input VRT receives a reset voltage. The output VOUT from the amplifier is coupled to an inverting input of a comparator. The non-inverting input of the comparator receives a reference voltage (COMPINP). The voltage COMPINP may selectively equal either the reset voltage VRT or a reference voltage VREF depending on the state of a control signal (VREFSW). An output of the comparator generates a digital signal (COMP). A switch selectively connects the output of the comparator to the inverting input of the comparator in response to a control signal (COMPRST). A switch is further coupled in parallel with the feedback capacitor and selectively actuated in response to a control signal (AMPRST). A number of analog reference signals are provided common to the sensing wafer. Those signals include a bias signal (NBIAS) for biasing the circuit for the comparator and amplifier and the voltages VRT, VREF and VREF2 (which supplies the charge injector).

Figure 4:
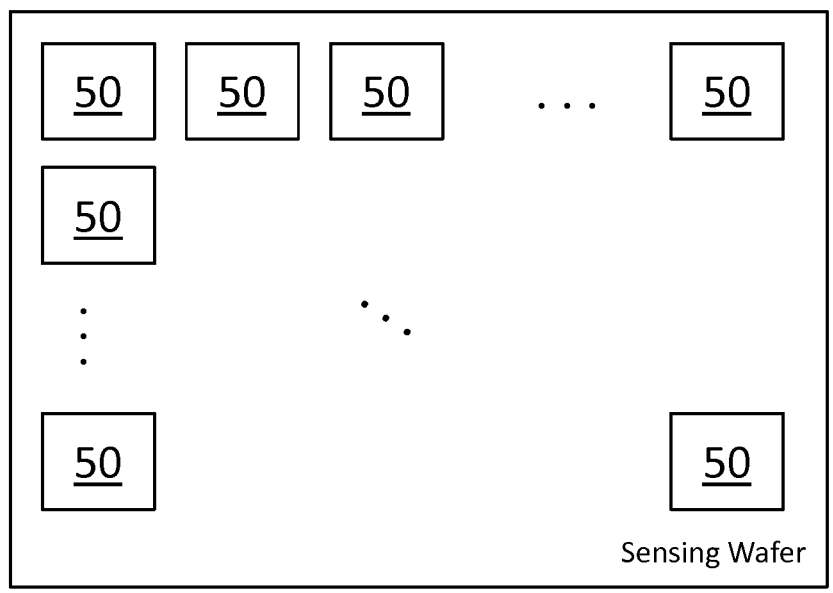
FIG. 4 shows an array of pixels in plan view.

The illustration in FIG. 3 for the sensing wafer shows the analog circuitry associated with just one pixel 50. It will be understood that the sensing wafer actually includes a plurality of such pixels 50 arranged in an array having multiple columns and multiple rows as shown in FIG. 4.

It will be noted that for each pixel 50, there is one output signal (COMP) and five input signals (AMPRST, COMPRST, VREFSW, FINEMODE and FINECONVCLK).

The second die includes a control logic circuit having an input that receives the COMP signal from each pixel 50. The control logic circuit is further configured to generate the AMPRST, COMPRST, VREFSW, FINEMODE and FINECONVCLK signals for application to the pixel 50. The control logic circuit receives a RESET control signal, an ENDFRAME control signal, a TESTMODE control signal, a ROWSEL<n> signal, a COLSEL<n> signal and a SYSCLK signal. The control logic circuit is further configured to generate the LSRST control signal, LSCLK signal, MSRST control signal, the MSCLK signal and the READ control signal for use in the second die. The second die further includes a first counter circuit (MS Counter) and a second counter circuit (LS Counter). The MS Counter has a clear input (CLR) that receives the logical inversion of the MSRST control signal, a clock input that receives the MSCLK signal and an output enable input (OE) receives the READ control signal. The LS Counter has a clear input (CLR) that receives the logical inversion of the LSRST control signal, a clock input that receives the LSCLK signal and an output enable input (OE) receives the READ control signal. The first counter is a ten-bit counter whose output bits form the most-significant Q[7:16] bits of a seventeen bit data bus. The second counter is a seven-bit counter whose output bits form the least-significant Q[0:6] bits of the seventeen bit data bus. The digital signal on the data bus presents a digital value of the light sensed by the photodiode.

Typically, each pixel 50 has its own corresponding digital control logic and counter(s), and the design of the digital control logic and counter(s) is same/similar for each pixel 50 apart from the ROWSEL<n> and COLSEL<n> logic. If the TESTMODE control signal is not asserted, then the logic will cause the READ control signal to be asserted for the pixel at the location identified by ROWSEL<n> and COLSEL<n>. When the TESTMODE control signal is asserted, then the logic will cause the reset and clock signals to counters to be activated as to a selected pixel, selected column or selected row.

It will be noted that the sensing wafer (first die) and digital wafer (second die) will typically use different operating (supply) voltages. For example, the second die for the digital wafer may use a supply voltage of 1.2V, while the first die for the sensing wafer may use a supply voltage of 2.8V. To account for this difference in supply voltages, appropriate level shifting circuitry must be provided with respect to interfacing the output signal (COMP) and five input signals (AMPRST, COMPRST, VREFSW, FINEMODE and FINECONVCLK) between the first die and second die. The level shifting circuitry is not shown in FIG. 3 and may be located on either the first die or second die.

The output signal (COMP) and five input signals (AMPRST, COMPRST, VREFSW, FINEMODE and FINECONVCLK) may, in an embodiment, comprise single-ended signals. In certain implementations, it may be desirable for one or more of the signals to be implemented as differential signals. The interface between the first die and second die may support only single-ended signals or may support differential signals. In the event that differential signaling is preferred, but the interface between the first die and second die supports only single-ended signals, appropriate differential/single-ended conversion circuitry (perhaps also supporting level shifting) may be provided.

The analog-digital pixel of FIG. 3 operates in three phases. In a first phase, referred to as a sensor exposure phase, the control logic responds to the RESET signal and asserts the AMPRST signal to actuate the switch causing the feedback capacitor to be discharged and the voltage at VOUT to be set equal to the reset voltage at VRT (i.e, reset the charge integrator circuit). The control logic further asserts the MSRST control signal to reset the first counter. The control logic also deasserts the FINEMODE control signal causing the switch to couple the photodiode to the VINN input of the integrator. The photodiode responds to illumination by generating the current Ipd. This current is integrated by the charge integrator and the voltage at VOUT ramps. When the ramping VOUT voltage reaches the voltage COMPINP, the comparator changes state at its output (COMP). The control logic responds to the change in state of the COMP signal by asserting the MSCLK signal. The first counter responds to the asserted MSCLK signal by incrementing its counter value. The control logic further responds to the change in state of the COMP signal by asserting the AMPRST signal to actuate the switch causing charge integrator circuit to be reset. The process is then repeated and with each change in state at the COMP output of the comparator the first counter increments its count value. It will be noted that a slope of the ramping voltage is correlated to the intensity of the light received by the photodiode. Thus, over a given time period for exposure, the number of times there is a change in state at the output of the comparator (with a corresponding increment of the count value) is proportional to the received light intensity.

At some later point in time, the exposure phase ends and a fine count conversion phase is commenced. In this regard, ending of the exposure phase may occur at a point in time where the VOUT voltage of integrator is somewhere between VRT and VREF. This is referred to in the art as a partial threshold state. The fine count conversion is performed to measure that voltage. During this phase, the control logic no longer accesses the first counter so the count value stored therein at the end of the sensor exposure phase is saved.

The start of the fine conversion phase is indicated by control logic receipt of the ENDFRAME control signal. The control logic asserts the FINEMODE control signal to cause the switch to disconnect the photodiode from the integrator. The assertion of the ENDFRAME control signal is processed by the control logic to implement three operations: inhibiting further resetting of the charge integrator, resetting the second counter through the assertion of the LSRST control signal and enabling the charge integrator. The fine conversion clock (FINECONVCLK) is applied by the logic circuit to the charge injector. The charge injector responds to each pulse in the clock by injecting a small amount of charge (derived from the voltage VREF2) into the VINN input of the charge integrator. Each injection of charge is accompanied by a corresponding incrementing of the count value in the second counter in response to the logic circuit asserting the LSCLK signal. The charge integrator integrates the injected charge and the output voltage VOUT continues to ramp. When the ramping VOUT voltage reaches the voltage COMPINP, the comparator changes state at its output (COMP). The control logic responds to the change in state of the COMP signal by blocking further change of the LSCLK signal. Since the control logic is no longer accessing the second counter, the count value stored therein at the end of the fine conversion phase is saved.

At this point, the readout phase is commenced. The READ control signal is asserted by the control logic and the first and second counters respond thereto by outputting their stored count values to form the seventeen-bit digital output signal indicative of the sensed illumination.

The VREFSW and COMPRST control signals are related to operations during sensor exposure with respect to performing correlated double sampling as known to those skilled in the art.

Figure 5:
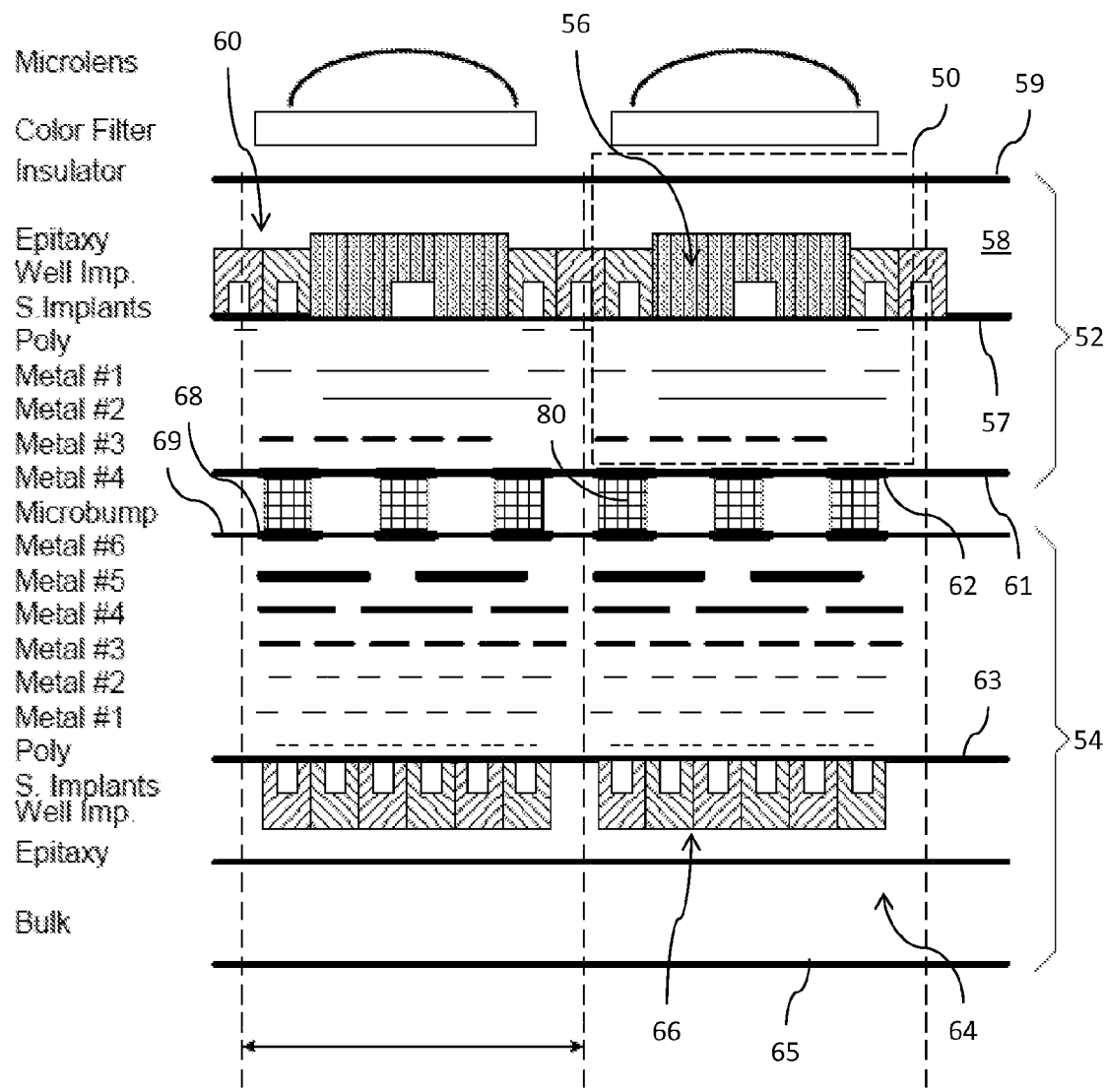
FIG. 5 is a cross-sectional view of the analog-digital pixel of FIG. 4 implemented in the stacked-die configuration.

Reference is now made to FIG. 5 showing a cross-section of the analog-digital pixel implemented in the stacked-die configuration. A first die 52, referred to as the sensing wafer, is stacked on a second die 54, referred to as the digital wafer.

The first die 52 is fabricated to include a plurality of pixels 50 arranged in an array having multiple columns and multiple rows as shown in FIG. 4. Two such pixels 50 are shown in FIG. 5 positioned adjacent each other with a given pixel pitch distance. The pixels 50 are preferably implemented in back-side illumination (BSI) technology. As known by those skilled in the art, BSI technology comprises the formation of the photosensitive area 56 for each pixel on a front side 57 of a semiconductor substrate 58 (including a thin 2-5 µm epitaxial layer) that also has a back side 59. The photosensitive area 56 may comprise a well region within the epitaxial layer that is doped with a first conductivity type dopant, with the epitaxial layer being doped with a second conductivity type dopant. The front side 57 of the substrate may further support other integrated circuit structures 60 (such as the wells and source implants of different types for transistors associated with circuitry of the pixel of the sensing wafer as well as poly silicon (poly) structures). The well region for the photosensitive area 56 is preferably deeper that the other structures 60. The other structures may, for example, include a second conductivity type well to isolate the well region for the photosensitive area 56. This second conductivity type well may further include first conductivity type implants associated with the formation of nMOS transistors. Although the structures are shown adjacent each other, this is by example only as there may be an advantage to including epitaxial material between wells to address concerns with leakage (dark) current. A further benefit of the use of lightly doped epitaxy for the substrate is that the capacitance of the p-n junction for photosensor is reduced, and this results in a reduction of readout node with respect to the charge integrator. Reference is made to U.S. Pat. No. 6,998,659 (incorporated by reference).

Alternatively, a first conductivity type well may be provided between second conductivity type wells. This serves two functions. First, the first conductivity type well allows for the implant of second conductivity type implants associated with the formation of pMOS transistors. Thus, support is provided on the first die 52 for the use of complementary MOS (CMOS) circuitry, and a wider range of circuits can be implemented with the advantages of low power consumption. Second, the first conductivity type well may be appropriately biased (for example, biased at a positive voltage for an n-type dopant). This bias voltage will create an electric field that attracts electrons near the boundary of the pixel. Although this will consume some of the photo-generated charge in the pixel with a corresponding reduction in signal level, the localized electric field will result in in consumption at the border between pixel and assist with the reduction in cross-talk.

On the back side 59, a transparent insulating layer is formed to cover the die wafer (this layer functioning in one implementation with a silicon-on-insulator (SOI) substrate as an etch stop when the substrate is thinned). A color filter is deposited for each pixel and an optional microlens may be formed on the color filter (the microlens functioning to focus light and reduce crosstalk caused by light passing through a filter and entering an adjacent pixel). The color filters are typically arranged in a Bayer pattern. A planarization layer, not explicitly shown, surrounds the filters and may support the microlenses. The BSI technology receives light through the back side 59 which is converted in the photosensitive area 56.

The gate oxide for the transistors is provided on the front side 57 over the integrated circuit structures 60 and their included implants. A polysilicon deposit on that oxide serves to form the transistor gate electrodes. A plurality of metallization layers (metal #1, etc.) are then formed over the poly gates to provide circuit interconnections and power routing. The metal of each metallization layer is surrounded by an insulating material, and the various lines of metal are interconnected between metallization layers by conductive vias (not shown, but well known to those skilled in the art). A first metallization layer, metal #1, is typically used for local interconnection (i.e., carrying signals between various circuit elements of a single pixel) as well as for the formation of a first plate for the capacitors used in the sensing wafer circuitry. A second metallization layer, metal #2, is also used for local interconnection and the formation of a second plate of the capacitors. Metal #2 may also support the connection of various control signals (RESET, ENDFRAME, SYSCLK, etc. as shown in FIG. 3) along with the reference signals (NBIAS, VRT, VREF, etc.). In a preferred implementation, the capacitors are implemented using two metal layers, but alternatively could be implemented in a single layer through interdigitation, or implemented in multiple layers using a three-dimensional capacitive structure. A third metallization layer, metal #3, is typically used for interconnection between pixels as well as power supply routing. A last one of the metallization layers, in this case metal #4, is provided with externally accessible contact structures 62 that are exposed by openings on an externally accessible contact structure surface 61. The last metallization later is typically thicker than the other metallization layers because the added thickness produces a lower resistance per unit area. It is therefore preferable to route signals carrying larger currents in this thicker top metallization layer. The advantage of BSI technology is that light collection is not obstructed by the metal of the metallization layers, and thus as many metallization layers as needed can be used.

The second die 54 is fabricated to include integrated circuits on a front side 63 of a semiconductor substrate 64 (including an epitaxial layer and a bulk layer) that also has a back side 65. The integrated circuits include integrated circuit structures 66 (such as the wells and source implants of different types for transistors associated with digital circuitry of the digital wafer as well as poly silicon (poly) structures for transistor gates). Because the second die 54 is optimized for digital circuits, the bulk portion of the substrate will be highly doped and the epitaxial portion of the substrate will be a thin 2-5 µm layer. On the front side 63, a plurality of metallization layers (metal #1, etc.) are formed over the poly to provide circuit interconnections and power routing. The metal of each metallization layer is surrounded by an insulating material, and the various lines of metal are interconnected between metallization layers by conductive vias (not shown, but well known to those skilled in the art). A digital circuit will typically need more metallization layers than an analog circuit in order to ease the routing of the digital signals. A last one of the metallization layers, in this case metal #6, is provided with externally accessible contact structures 68 that are exposed by openings on an externally accessible contact structure surface 69.

When the first die is stacked on the second die, the externally accessible contact structures 62 and 68 are aligned and electrically and mechanically connected using a conductive inter-wafer connection such as microbumps 80 or other solder-like connections (for example, 3D vias, through silicon vias (TSVs), copper-copper bonding, hybrid SiO$_2$+Cu bonding, and the like as known in the art).

Figure 6A:
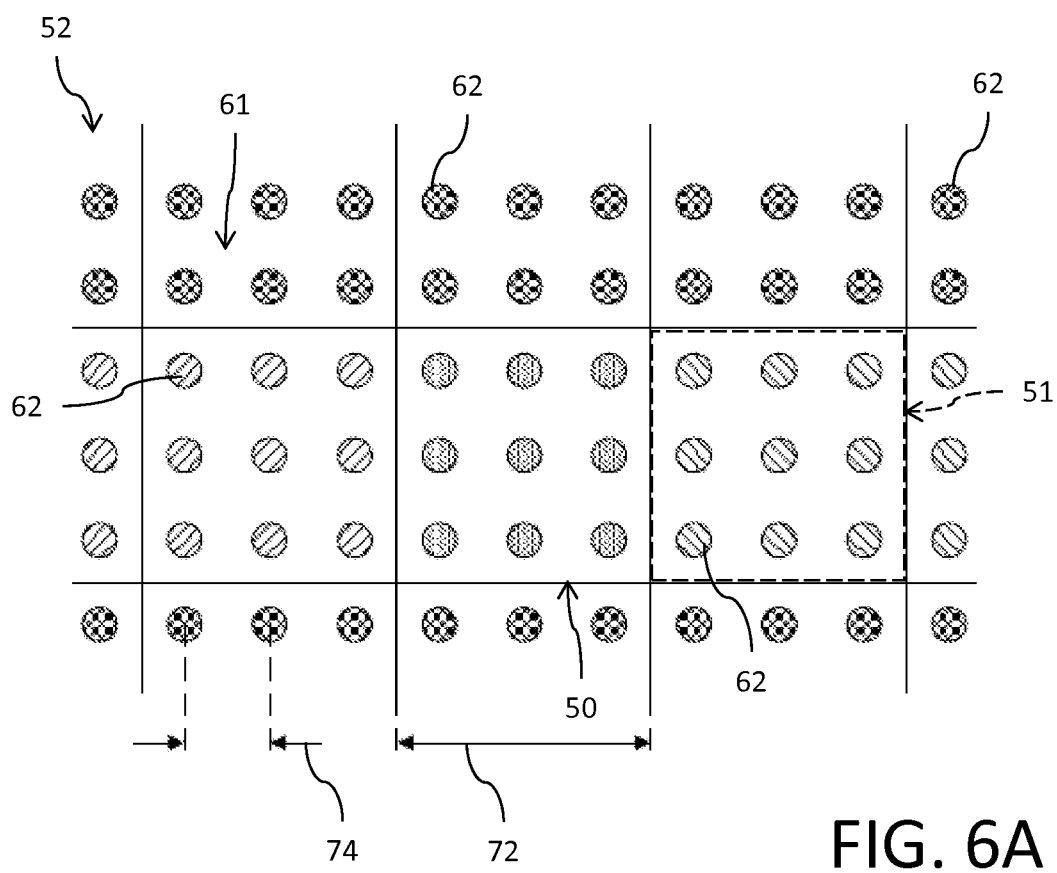
FIG. 6A is a plan view of an externally accessible contact structure surface with externally accessible contact structures for a first die of the stacked-die configuration of FIG. 5.

Reference is now made to FIG. 6A showing a plan view of the externally accessible contact structure surface 61 for the first die 52. The general location of the pixels 50 and the area they occupy is shown by the intersecting solid vertical and horizontal lines. As this view is of the externally accessible contact structure surface 61, the pixels 50 are not visible due the metallization layers. The pixels 50 have a pixel pitch distance 72. Notably, this pixel pitch distance is the same in orthogonal directions (i.e., the pixels 50 have square areas). However, it will be understood that the pixel areas may instead be rectangular. For certain high definition imaging applications, such as for the imaging sensors of cameras like digital single-lens reflex (DSLR) cameras and mirrorless interchangeable lens cameras (MILC), the pixel pitch must be very small, for example, on the order of 5-10 µm. Within the 25-100 µm$^2$ area available per pixel 50 on the externally accessible contact structure surface, a sufficient number of externally accessible contact structures 62 must be provided to support the required pixel signals in the hybrid analog-digital pixel circuit. As discussed above for the hybrid analog-digital pixel circuit, at least six externally accessible contact structures 62 must be provided for the one output signal (COMP) and five input signals (AMPRST, COMPRST, VREFSW, FINEMODE and FINECONVCLK). The externally accessible contact structures 62 are arranged in groups 51 corresponding to the pixels 50, with the externally accessible contact structures in each group arranged in an array of rows and columns, the externally accessible contact structures having an externally accessible contact structure pitch 74. An area of each group 51 corresponds to an area occupied by each corresponding pixel 50. In the illustration of FIG. 6A, a 3×3 array of externally accessible contact structures 62 is provided in the group 51 and thus nine signal connections are supported. Although a minimum of six externally accessible contact structures 62 are required, the three extra externally accessible contact structures made available in the 3×3 array would support the use of differential signaling (i.e., positive and negative components of one or more of the signals). The externally accessible contact structure pitch 74 may, for example, be on the order of 1-3 µm for a pixel pitch of 5-10 µm (in a specific example, the externally accessible contact structure pitch is 2 µm for a pixel pitch of 6 µm). In this configuration, the signals on the externally accessible contact structures 62 for each group are the signals relating to operation of only that pixel 50 which corresponds to the particular group 51.

Figure 6B:
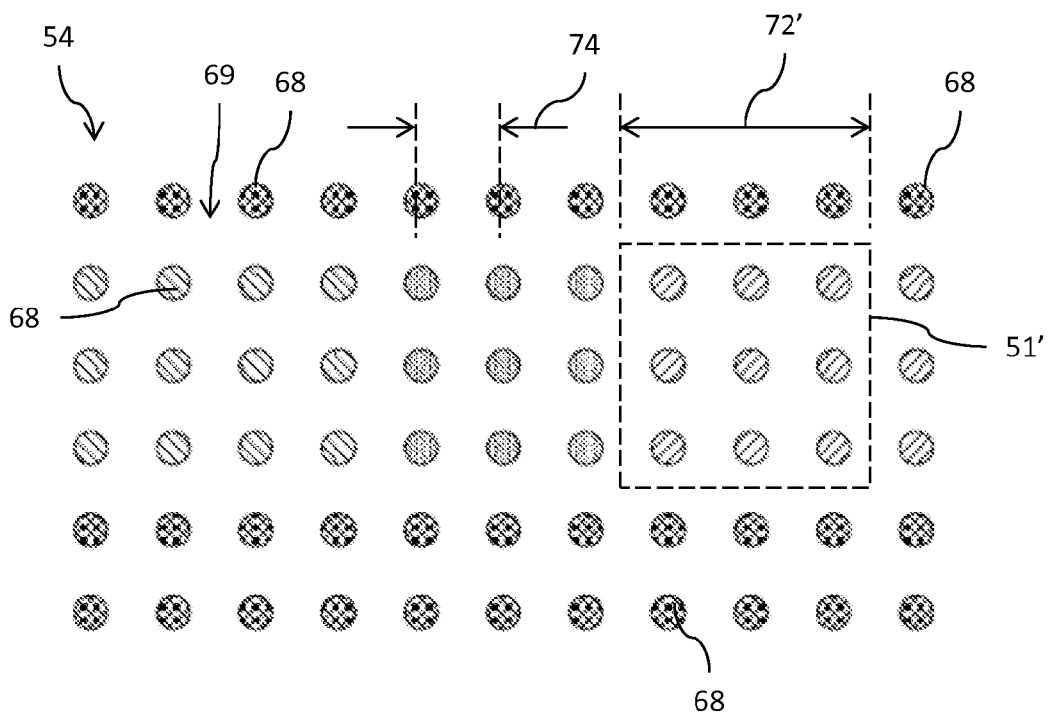
FIG. 6B is a plan view of an externally accessible contact structure surface with externally accessible contact structures for a second die of the stacked-die configuration of FIG. 5.

Reference is now made to FIG. 6B showing a plan view of the externally accessible contact structure surface 69 for the second die 54. The externally accessible contact structures 69 are arranged in groups 51' that correspond to the groups 51 and pixels 50. In an implementation, an area of each group 51' matches and is aligned with the area of the corresponding group 51 (and still further the areas match and are aligned with the area of the pixel 50, see FIG. 7). The groups 51' have a group pitch distance 72' that is equal to the pixel pitch 72 for the first die 52. A sufficient number of externally accessible contact structures 69 must be provided for each group 50' to support the required pixel signals. As discussed above for the hybrid analog-digital pixel circuit, at least six externally accessible contact structures 69 must be provided for the one output signal (COMP) and five input signals (AMPRST, COMPRST, VREFSW, FINEMODE and FINECONVCLK). The externally accessible contact structures 69 are arranged in an array of rows and columns with an externally accessible contact structure pitch 74 that is equal to the externally accessible contact structure pitch for the first die 52. In the illustration of FIG. 6B, a 3×3 array of externally accessible contact structures 69 is provided and thus nine signal connections are supported. Although a minimum of six externally accessible contact structures 69 are required, the three extra externally accessible contact structures made available in the 3×3 array would support the use of differential signaling (i.e., positive and negative components of one or more of the signals). The externally accessible contact structure pitch 74 may, for example, be on the order of 1-3 µm for a pixel pitch 50 of 5-10 µm (in a specific example, the externally accessible contact structure pitch is 2 µm for a pixel pitch of 6 µm).

Figure 7:
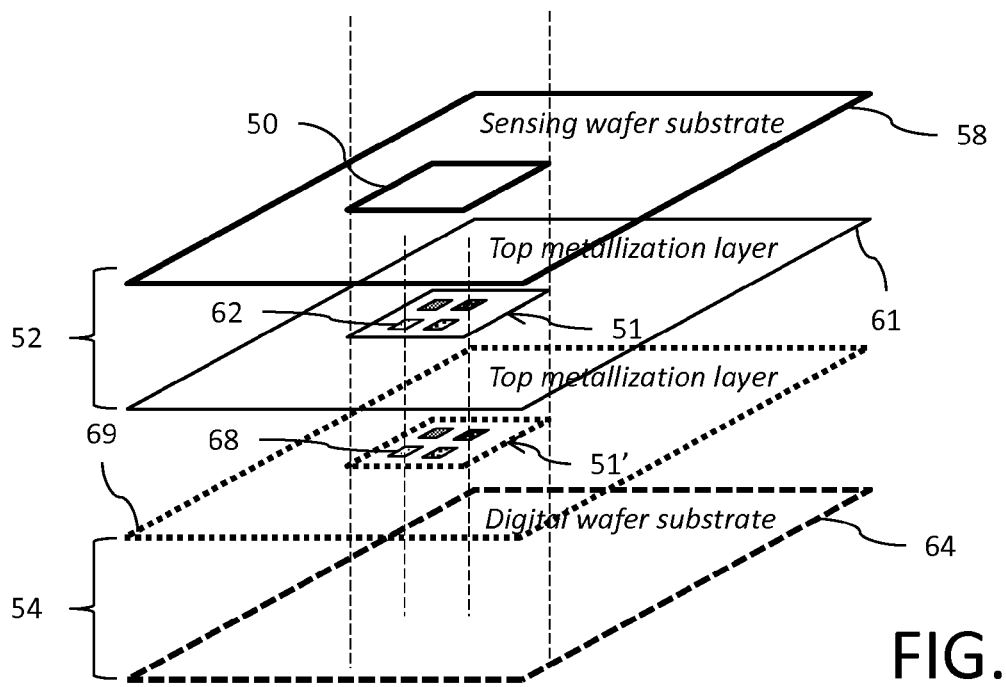
FIG. 7 illustrates the stacked configuration and alignment of the corresponding areas for a pixel, a group of sensing wafer externally accessible contact structures and a group of digital wafer externally accessible contact structures.

FIG. 7 schematically illustrates the stacked configuration of the sensing wafer and digital wafer. The sensing wafer 52 includes the substrate 58 and plurality of metallization layers terminating at a top metallization layer with surface 61. The substrate 58 includes a plurality of pixels, with only one such pixel 50 shown in this view. The pixel 50 includes the photosensitive region and associated analog circuitry. The externally accessible contact structures 62 for signals associated solely with pixel 50 are provided in a group 51 (only four externally accessible contact structures shown here for clarity). It will be noted that an area of the group 51 and an area of the pixel 50 are matching and aligned. The digital wafer 54 includes the substrate 64 and plurality of metallization layers terminating at a top metallization layer with surface 69. The externally accessible contact structures 68 for signals associated solely with pixel 50 are provided in a group 51' (only four externally accessible contact structures shown here for clarity). It will be noted that an area of the group 51' and an area of the group 51 are matching and aligned (and are further matching and aligned with the area of the pixel 50). Furthermore, the externally accessible contact structures 62 and 68 are aligned so that when the wafers are stacked an electrical connection can be made.

Various embodiments with different variations have been described here above. It should be noted that those skilled in the art may combine various elements of these various embodiments and variations. Such alterations, modifications, and improvements are intended to be part of this disclosure, and are intended to be within the scope of the present invention. Accordingly, the foregoing description is by way of example only and is not intended to be limiting. The present invention is limited only as defined in the following claims and the equivalents thereto.

The invention claimed is:

1. An image sensing system, comprising:
   a sensing wafer including a first semiconductor substrate having a front side and a back side, the front side including a plurality of photosensitive regions sensitive to light received through the back side, each photosensitive region associated with a pixel, the sensing wafer including a plurality of said pixels arranged in an array;
   the sensing wafer further including a plurality of first metallization layers on the front side of the first semiconductor substrate, said plurality of first metallization layers including a top metallization layer including a plurality of first externally accessible contact structures, said first externally accessible contact structures arranged in a plurality of first groups, the first groups corresponding to the plurality of pixels, the first externally accessible contact structures in each first group carrying signals relating to operation of only the pixel corresponding to that first group;
   a digital wafer including a second semiconductor substrate having a front side and a back side, the front side including a plurality of integrated circuit regions for implementing digital circuitry, and
   the digital wafer further including a plurality of second metallization layers on the front side of the second semiconductor substrate, said plurality of second metallization layers including a top metallization layer including a plurality of second externally accessible contact structures, said second externally accessible contact structures arranged in a plurality of second groups, the second groups corresponding to the plurality of pixels, the second externally accessible contact structures in each first group carrying the signals relating to operation of only the corresponding pixel;
   wherein the first and second externally accessible contact structures in the first and second groups, respectively, are aligned and electrically connected when the sensing wafer and digital wafer are stacked.

2. The image sensing system of claim 1, wherein an area of the first group matches and is aligned with an area of the corresponding second group and further matches and is aligned with an area of the corresponding pixel.

3. The image sensing system of claim 1, wherein a pitch of the first groups is equal to a pitch of the second groups.

4. The image sensing system of claim 3, wherein the pitch of the first and second groups is 5-10 μm.

5. The image sensing system of claim 3, wherein a pitch of the pixels is equal to the pitches of the first and second groups.

6. The image sensing system of claim 1, wherein a pitch of the first externally accessible contact structures is equal to a pitch of the second externally accessible contact structures.

7. The image sensing system of claim 6, wherein the pitch of the first and second externally accessible contact structures is 1-3 μm.

8. The image sensing system of claim 1, further comprising microbump structures for making the electrical connection of the first and second externally accessible contact structures.

9. The image sensing system of claim 1, wherein the signals relating to operation of only the pixel corresponding to that first group comprise:
   a comparator output signal generated in response to integration of photodetector charge from the photosensitive region;
   a control signal generated by a logic circuit on the digital wafer and configured to control photodetector charge integration reset.

10. The image sensing system of claim 1, wherein the signals relating to operation of only the pixel corresponding to that first group comprise:
    a comparator output signal generated in response to integration of photodetector charge from the photosensitive region;
    a control signal generated by a logic circuit on the digital wafer and configured to control comparator reset.

11. The image sensing system of claim 1, wherein the signals relating to operation of only the pixel corresponding to that first group comprise:
    a comparator output signal generated in response to integration of photodetector charge from the photosensitive region;
    a control signal generated by a logic circuit on the digital wafer and configured to control charge injection into an integrator operable to integrate photodetector charge from the photosensitive region.

12. The image sensing system of claim 1, wherein the signals relating to operation of only the pixel corresponding to that first group comprise:
    a comparator output signal generated in response to integration of photodetector charge from the photosensitive region;
    a clock signal generated by a logic circuit on the digital wafer and configured to clock charge injection into an integrator operable to integrate photodetector charge from the photosensitive region.

13. The image sensing system of claim 1, wherein the signals relating to operation of only the pixel corresponding to that first group comprise:
    a comparator output signal generated in response to integration of photodetector charge from the photosensitive region;
    a control signal generated by a logic circuit on the digital wafer and configured to control a selection of a reference voltage for the comparator.

14. An image sensing system, comprising:
    a first semiconductor substrate having a front side and a back side and a pixel comprising a photosensitive region formed on the front side and sensitive to light received through the back side;
    a plurality of first metallization layers on the front side of the first semiconductor substrate, said plurality of first metallization layers including a top metallization layer including a group of first externally accessible contact structures arranged in an array of rows and columns, said group of first externally accessible contact structures corresponding to said pixel, the first externally accessible contact structures carrying control signals for controlling operation of only that pixel;

a second semiconductor substrate having a front side and a back side, the front side including a plurality of integrated circuit regions for implementing digital circuitry for generating the control signals for controlling operation of that pixel, and a plurality of second metallization layers on the front side of the second semiconductor substrate, said plurality of second metallization layers including a top metallization layer including a group of second externally accessible contact structures arranged in an array of rows and columns, said group of second externally accessible contact structures corresponding to that pixel, the second externally accessible contact structures carrying control signals for controlling operation of only that pixel;

wherein the first and second externally accessible contact structures face each other and are aligned and electrically connected.

15. The image sensing system of claim 14, wherein an area of the group of first externally accessible contact structures matches and is aligned with an area of the group of second externally accessible contact structures and further matches and is aligned with an area of the pixel.

16. The image sensing system of claim 14, further comprising microbump structures for making the electrical connection of the first and second externally accessible contact structures.

17. The image sensing system of claim 14, wherein the control signals for controlling operation of that pixel comprise a control signal generated by the digital circuitry and configured to control resetting of a charge integrator for the pixel.

18. The image sensing system of claim 14, wherein the control signals for controlling operation of that pixel comprise a control signal generated by the digital circuitry and configured to resetting of a comparator for the pixel.

19. The image sensing system of claim 14, wherein the control signals for controlling operation of that pixel comprise a control signal generated by the digital circuitry and configured to control charge injection into an integrator for the pixel.

20. The image sensing system of claim 14, wherein the control signals for controlling operation of that pixel comprise a clock signal generated by the digital circuitry and configured to clock injection of charge into an integrator for the pixel.

21. The image sensing system of claim 14, wherein the control signals for controlling operation of that pixel comprise a control signal generated by the digital circuitry and configured to control a selection of a reference voltage for a comparator for the pixel.

22. An image sensing system, comprising:

a first semiconductor substrate having a front side and a back side and a pixel comprising a photosensitive region formed on the front side and sensitive to light received through the back side and supporting a charge integrator coupled to photosensitive region and a comparator coupled to the charge integrator;

a plurality of first metallization layers on the front side of the first semiconductor substrate, said plurality of first metallization layers including a top metallization layer including a first externally accessible contact structure and a second externally accessible contact structure, said first externally accessible contact structure carrying a comparator output signal and said second externally accessible contact structure carrying a charge integrator reset signal;

a second semiconductor substrate having a front side and a back side, the front side including a plurality of integrated circuit regions for implementing digital circuitry for processing the comparator output signal and generating the charge integrator reset signal, and a plurality of second metallization layers on the front side of the second semiconductor substrate, said plurality of second metallization layers including a top metallization layer including a third externally accessible contact structure carrying the comparator output signal and a fourth externally accessible contact structure carrying the charge integrator reset signal;

wherein the first and third externally accessible contact structures face each other and are aligned and electrically connected; and wherein the second and fourth externally accessible contact structures face each other and are aligned and electrically connected.

23. The image sensing system of claim 22, wherein the first and second externally accessible contact structures are arranged in a first group, and wherein the third and fourth externally accessible contact structures are arranged in a second group, and wherein an area of the first group matches and is aligned with an area of the second group.

24. The image sensing system of claim 23, wherein the areas of the first and second groups match and are aligned with an area of the pixel.

* * * * *